(12) United States Patent
Jiang

(10) Patent No.: US 9,774,260 B2
(45) Date of Patent: Sep. 26, 2017

(54) DRIVER FOR LOW EMISSION SWITCHING REGULATOR WITH SWITCH SENSING OF REVERSE RECOVERY

(71) Applicant: STMicroelectronics (China) Investment Co. Ltd, Shanghai (CN)

(72) Inventor: Ming Jiang, Shanghai (CN)

(73) Assignee: STMICROELECTRONICS (CHINA) INVESTMENT CO. LTD, Shanghai (CN)

( * ) Notice: Subject to any disclaimer, the term of this patent is extended or adjusted under 35 U.S.C. 154(b) by 66 days.

(21) Appl. No.: 14/690,855

(22) Filed: Apr. 20, 2015

(65) Prior Publication Data

US 2016/0301306 A1 Oct. 13, 2016

(30) Foreign Application Priority Data

Apr. 7, 2015 (CN) .......................... 2015 1 0161647

(51) Int. Cl.
| | |
|---|---|
| H02M 3/158 | (2006.01) |
| H02M 1/08 | (2006.01) |
| H02M 1/44 | (2007.01) |
| H03K 17/16 | (2006.01) |

(52) U.S. Cl.
CPC ........... *H02M 3/1588* (2013.01); *H02M 1/08* (2013.01); *H02M 1/44* (2013.01); *H03K 17/166* (2013.01); *H02M 3/158* (2013.01)

(58) Field of Classification Search
CPC ......... H02M 2001/0051; H02M 3/156–3/1588
See application file for complete search history.

(56) References Cited

U.S. PATENT DOCUMENTS

| | | | | |
|---|---|---|---|---|
| 4,413,300 A | * | 11/1983 | Sumi | ................... H04L 25/028 330/207 P |
| 5,457,433 A | * | 10/1995 | Westwick | ............... H03B 5/366 326/26 |
| 6,396,250 B1 | | 5/2002 | Bridge | |
| 7,852,125 B2 | | 12/2010 | Lopez et al. | |
| RE44,180 E | | 4/2013 | Cha et al. | |
| 8,519,684 B2 | * | 8/2013 | Chuang | ............... H02M 3/1588 323/271 |
| 2013/0038307 A1 | * | 2/2013 | Saito | ..................... H02M 3/335 323/283 |

OTHER PUBLICATIONS

National Semiconductor. LM 741 Operational Amplifier. Aug. 2000. pp. 1-7.*

* cited by examiner

*Primary Examiner* — Harry Behm
*Assistant Examiner* — Peter Novak
(74) *Attorney, Agent, or Firm* — Gardere Wynne Sewell LLP

(57) ABSTRACT

A switching regulator includes circuitry for reducing conductive emissions caused when the regulators switch from one transistor switch to the other. The switching regulator includes at least one switch with a diode connected from the source to the drain of at least one of the transistor switches. When the regulator switches from one transistor switch to the other, the circuitry initiates turning on the switch with a relatively small, current-limited signal, waits for the diode across the recently turned off switch to complete reverse recovery, and then quickly turns the new switch fully on.

18 Claims, 2 Drawing Sheets

DRIVER FOR LOW EMISSION SWITCHING REGULATOR WITH SWITCH SENSING OF REVERSE RECOVERY

PRIORITY CLAIM

This application claims priority from Chinese Application for Patent No. 201510161647.7 filed Apr. 7, 2015, the disclosure of which is incorporated by reference.

BACKGROUND

Automotive electronics are different than consumer electronics. For automotive electronics, every integrated circuit (IC) must be tested for electromagnetic compatibility, commonly referred to in the art as "EMC testing." EMC requirements are much less stringent for consumer electronics than for automotive electronics. More specifically, an IC should not introduce too much noise in its supply lines or bus lines through parasitic inductance. When current (di/dt) is introduced through the supply side of an IC too quickly, the IC may experience a significant amount of voltage noise due to the parasitic inductance in bonding wires. For automotive electronics, such noise may result in a faulty or damaged IC.

The trend toward lower power, portable equipment has driven the technology and the requirement for converting power efficiently. Modern IC switching regulators are small, flexible, and allow either step-up (boost) or step-down (buck) operation. Switching regulators are commonly preferred over traditional linear regulators because of their characteristic high efficiency and high power density stemming from smaller magnetic, capacitive, and heat sink components. These switching regulators may be constructed from various arrangements of a switch, a diode, an inductor, and a capacitor.

The primary limitations of switching regulators as compared to linear regulators are their output noise, electromagnetic and radio-frequency interference emissions, and the proper selection of external support components. EMC is one of the basic requirements for electronic control units, and low conducted emission testing is essential for the development of ICs to make sure noise in battery or supply lines is well controlled. One particular type of switching regulator, a buck switching regulator, uses two power switches, such as power metal-oxide-semiconductor field-effect transistors (MOSFETs), to selectively couple an inductor to a high power supply and a low power supply. Fast switching currents in switching regulators introduce voltage ringing at bonding wires due to parasitic inductance. For instance, a 2 nH parasitic inductance in bonding wires with 1 A of lead current every 2 ns will produce voltage ringing of 1V, as indicated in the following equation:

$$V=L*di/dt=2 \text{ nH}*1 \text{ A}/2 \text{ ns}=1V.$$

To reduce voltage ringing, either the parasitic inductance or the current slew rate needs to be reduced.

One traditional way to reduce parasitic inductance in a switching regulator is to connect multiple bonding wires between the voltage supply and the high-side switching regulator MOSFET and the low-side switching regulator MOSFET and ground. But use of additional wires takes up costly space on an IC and may require additional chip pins, both of which raise costs of an IC.

SUMMARY

This Summary is provided to introduce a selection of concepts in a simplified form that are further described below in the Detailed Description. This Summary is not intended to identify key features or essential features of the claimed subject matter. Nor is it intended to specifically limit all embodiments to particular features.

One embodiment is directed to a system for operating a switching regulator using a high-side switch coupled to a low-side switch. The system includes a source follower circuit configured to supply a gate of the high-side switch with a current-limited signal when the low-side switch is turned off. A switch sensing circuit is configured to sense completion of reverse recovery in the body diode of the low-side switch and supply the gate of the high-side switch with an output signal upon completion of the reverse recovery in the diode.

In one embodiment, the source follower circuit and the switch sensing circuit are clocked according to a clock signal.

In one embodiment, the source follower circuit includes a gate source voltage generator matched with high side switch, which limits the gate voltage and the maximum current of the high-side switch.

In one embodiment, receipt of the current-limited signal at the gate of the high-side switch initiates turning on of the high-side switch to allow completion of reverse recovery of the body diode of the low side switch with maximum current limited in the high side switch.

In one embodiment, the switch sensing circuit is configured to sense a sensed voltage and start to charge up gate of high side switch by current generator to achieve controlled voltage slew rate of the switching node of SW when the sensed voltage at the second transistor terminal indicates the completion of the reverse recovery of the diode.

In one embodiment, the switch sensing circuit comprises a plurality of transistors operative to generate the output signal upon completion of the reverse recovery of the diode.

In one embodiment, the switch sensing circuit is configured to sense a sensed voltage and generate the output signal when the sensed voltage at the second transistor terminal indicates the diode has a voltage within a threshold voltage difference from full reverse recovery of the diode.

In one embodiment, the current-limited signal initiates turning on of the high-side switch and the output signal of the switch sensing circuit continues turning on the high-side switch.

Another embodiment is directed to a system for operating a switching regulator. The system includes a high-side switch receiving an input voltage; a low-side switch coupled to the high-side switch; a diode coupled across two terminals of the low-side switch; and a switch sensing circuit configured to sense completion of reverse recovery in the diode. The switch sensing circuit supplies the gate of the high-side switch with a first output signal upon completion of the reverse recovery in the diode, and the output signal is operative to cause the high-side switch to generate a switch output.

Another embodiment is directed to a system for operating a switching regulator comprising a high-side switch coupled to a low-side switch that is coupled to a diode. The system includes a source follower circuit configured to supply a gate of the high-side switch with a current-limited signal while the diode begins completion of reverse recovery; a switch sensing circuit configured to sense completion of the reverse recovery in the diode and supply the gate of the high-side switch with an output signal upon completion of the reverse recovery in the diode; and a gate charging circuit configured to supply the gate of the high-side switch with a gate charging signal after the reverse recovery of the diode has completed. Additionally, the gate charging signal is operative to cause the high-side switch to fully turn on.

In one embodiment, the low-side switch comprises a Shottkey diode.

In one embodiment, one or more clock signals synchronize the current-limited signal supplied by the source follower circuit, the output signal supplied by the switch sensing circuit, and/or the gate charging signal supplied by the gate charging circuit.

In one embodiment, the gate charging signal includes a larger current value than the current-limited signal supplied by the source follower circuit and the output signal supplied by the switch sensing circuit.

BRIEF DESCRIPTION OF THE DRAWINGS

The present invention is described in detail below with reference to the attached drawing figures, wherein.

DETAILED DESCRIPTION

The subject matter of the present invention is described with specificity herein to meet statutory requirements. But the description itself is not intended to limit the scope of this patent. Rather, the claimed subject matter might also be embodied in other ways or include different steps or combinations of steps similar to the ones described in this document in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Figure 1:
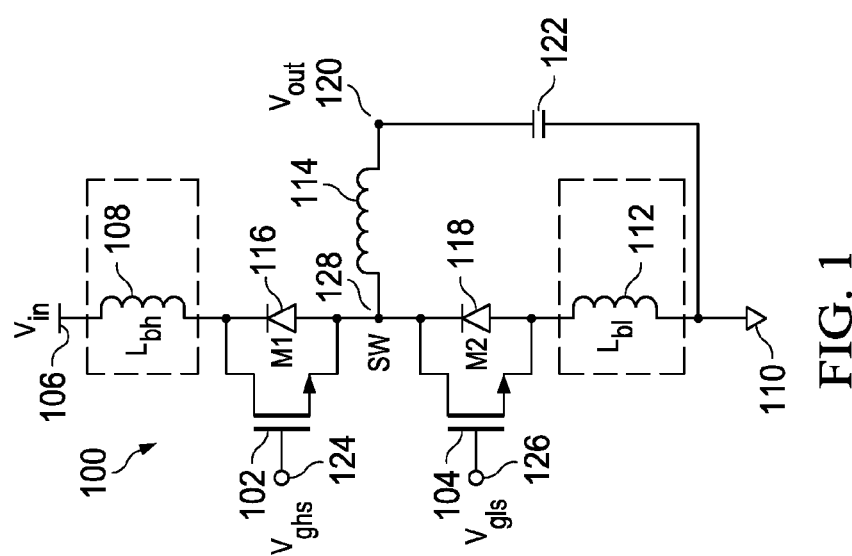
FIG. 1 is a schematic diagram of a synchronous switching regulator in accordance with one embodiment.

FIG. 1 illustrates a synchronous switching regulator 100 that includes a high-side switch (M1) 102 and a low-side switch (M2) 104, each comprising an n-type MOSFET. Alternative embodiments may other types of transistors or electrical switching elements. The drain of the high-side switch 102 is coupled to an input voltage (Vin) 106 and experiences a parasitic inductance designated as Lbh 108. The source of the low-side switch 104 is coupled to ground (GND) 110 and experiences a parasitic inductance designated as Lbl 112. Diodes 116 and 118 are respectively connected between the sources and drains of the high-side switch 102. Both switches 102 and 104 are implemented as synchronous rectifiers.

Figure 2:
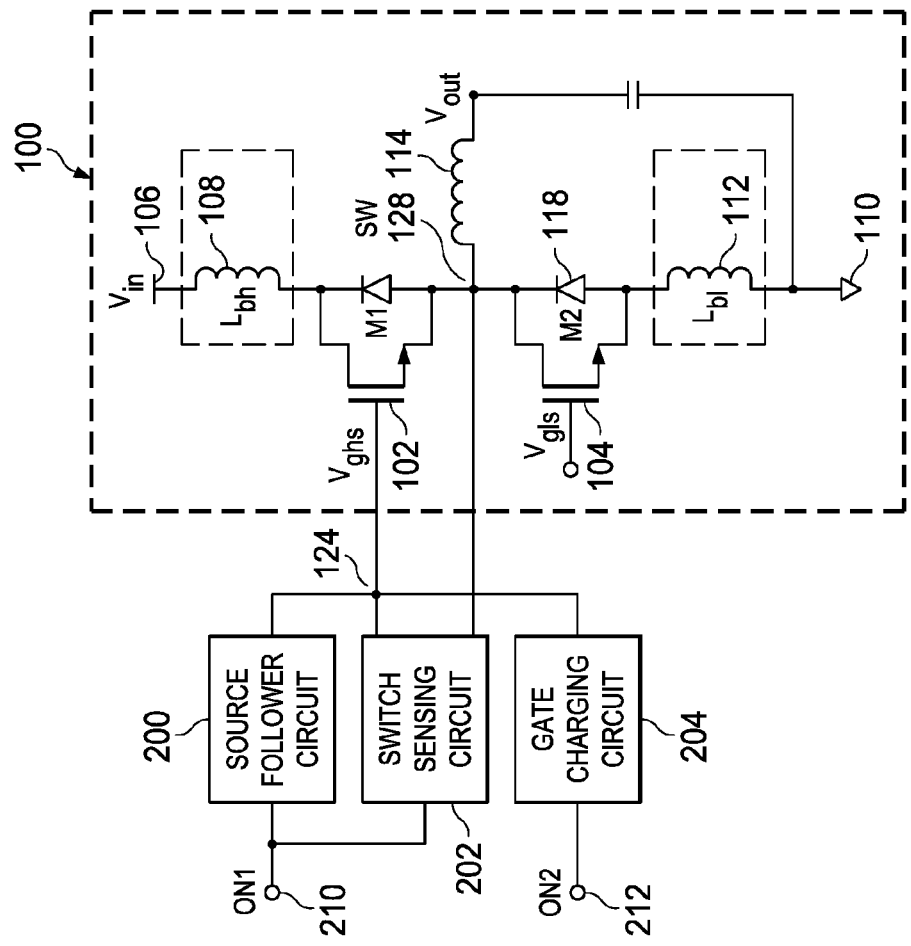
FIG. 2 is a block and schematic of a driver circuitry for reducing ringing and conducted emission in supply lines of a switching regulator with NMOS switches in accordance with one embodiment.
Figure 3:
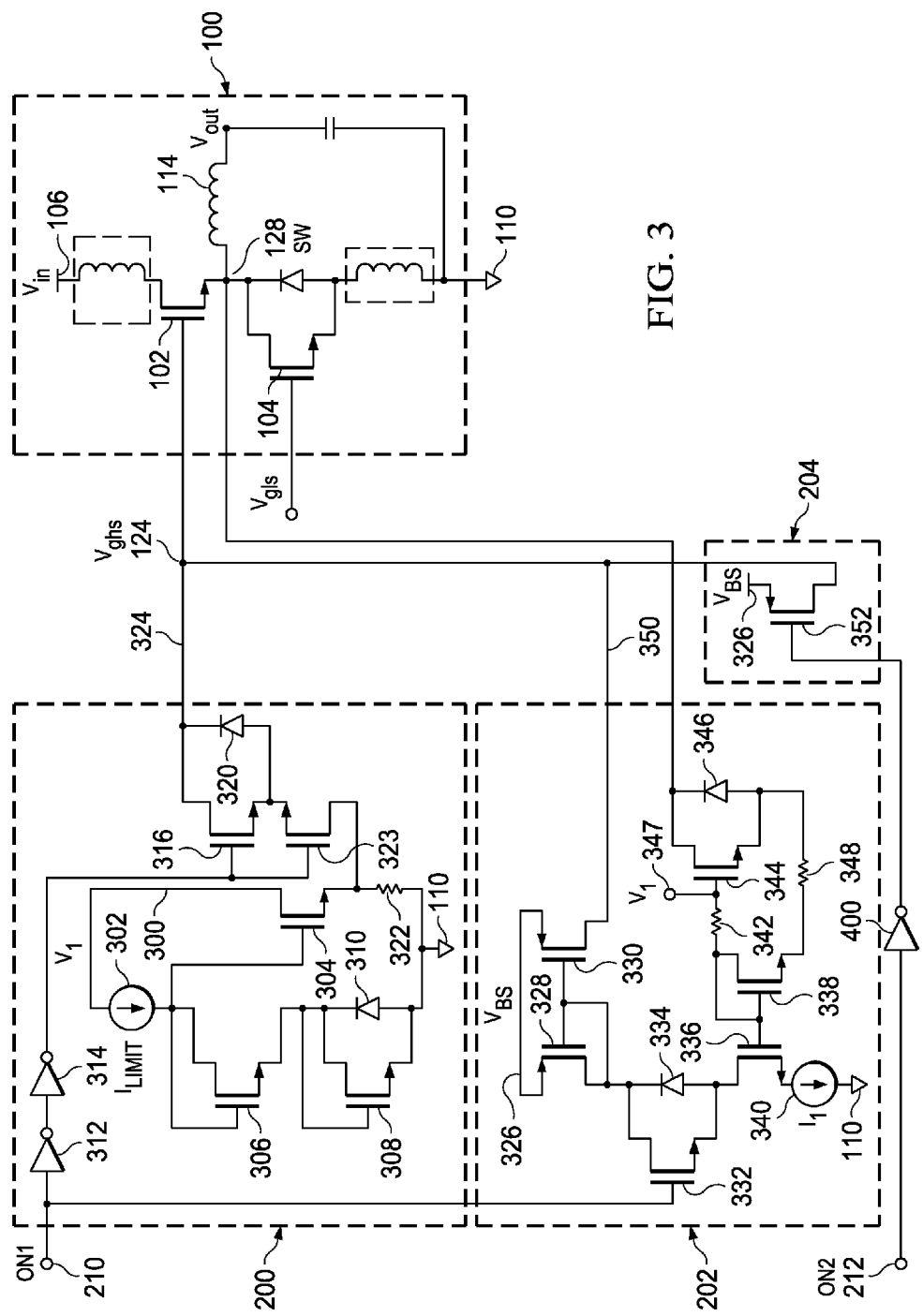
FIG. 3 is a schematic diagram of driver circuitry for reducing ringing and conducted emission in supply lines of a switching regulator with NMOS switches in accordance with one embodiment.

Parasitic inductances Lbh 108 and Lbl 112 are illustrated in FIGS. 1-3 as inductors, but in actuality, these parasitic inductances are not discrete components. Instead, parasitic inductances Lbh 108 and Lbl 112 represent the parasitic inductance experienced in bonding wires between Vin 106 and switch 102 and switch 104 and ground 110, respectively. To signify this, parasitic inductances Lbh 108 and Lbl 112 are illustrated in the accompanying drawings inside of dotted-line boxes, indicating that they are not actual inductors, but rather parasitic inductances felt in the shown circuitry. Embodiments herein work to reduce the parasitic inductances Lbh 108 and Lbl 112.

The high-side switch 102 is driven by a gate drive signal voltage Vghs 124. Vghs is supplied to the gate of the high-side switch 102. Likewise, gate drive signal voltage Vgls 126 is applied to the gate of low-side switch 104. The signals applied to the high-side switch 102 and the low-side switch 104 are applied alternatively to either the high-side switch 102 or the low-side switch 104 to provide a reduced average voltage at switching node SW 128.

To signify a load, an inductor 114 is shown coupled to a node SW 128 that is positioned between the source of the high-side switch 102 and the drain of the low-side switch 104. An output voltage (Vout) is provided on the output side of the inductor 114. In one embodiment, a capacitor 122 is connected to the output side of the inductor 114 and to ground (GND) 110 and functions to remove noise from the output of the inductor 114, producing a reduced Vout 120 at the illustrated output node.

Switching regulator 100 experiences significant parasitic inductances Lbh 108 and Lbl 112 when the low-side switch 104 is turned off and the high-side switch 102 is turned on too quickly or is supplied with a large amount of current at its gate. To avoid cross-conduction, one embodiment keeps both currents in the high-side switch 102 and the low-side switch 104 at zero during a small timeframe referred to herein as the "blanking time" as the low-side switch 104 is turned off and before the high-side switch 102 is turned on. It may take a few nanoseconds to turn off a synchronization current (Isync) in the low-side switch 104 at which time Isync will flow through the body of diode 118. Once the low-side switch 104 is turned off, the high-side switch 102 is turned on, and it may only take a few nanoseconds to get the current in the high-side switch 102 to reach Isync. If the driver supplying Vghs 124 at the high-side switch 102 is introduced too quickly or is too large, the current in the high-side switch 102, referred to herein as "ILbh," will continue to rise quickly. After reverse recovery of diode 118, current in Lbl, referred to herein as "ILbl," will quickly fall to 0, and ILbh will fall to Isync. Ringing will be visible in Lbl and Lbh that could possibly lead to excessive conducted emissions and/or failure of the synchronous switching regulator 100 or its IC.

While the synchronous switching regulator 100 of FIG. 1 is discussed herein, an alternative embodiment uses a Shottkey diode (not shown for the sake of clarity) as the low-side switch 104. In such an alternative embodiment, the Shottkey diode efficiently functions as the low-side switch 104 due to the Shottkey diode's low power loss, low turn-on voltage, fast recovery time, and low junction capacitance in comparison to an ordinary silicon P-N junction diode. When the Shottkey diode used as low-side switch 104 switches from the non-conducting to the conducting state (i.e., from "off" to "on"), the Shottkey diode experiences no or very little reverse recovery time as it abruptly recovers. For the sake of clarity, however, embodiments discussed herein reference a transistor as the low-side switch; however, the low-side switch may comprise a Shottkey diode or similar type of switch in alternative embodiments.

FIG. 2 illustrates a block and schematic diagram of driver circuitry for reducing ringing and conducted emissions in supply lines of the switching regulator 100 in accordance with one embodiment. The driver circuitry includes a source follower circuit 200, a switch sensing circuit 202, and a gate charging circuit 204 coupled to the gate of the high-side switch 102 of the switching regulator 100. The switch sensing circuit 202 is also coupled to the switching node SW 128.

One embodiment uses two different clock signals (ON1 210 and ON2 212) to control the frequency of the switching regulator. Specifically, ON1 210 is provided to the source follower circuit 200 and the switch sensing circuit 202, and ON2 212 is provided to the gate charging circuit 204. In one embodiments, these clock signals ON1 210 and ON2 212 are pulse-width modulated (PWM) signals supplied by other portions of an IC and function to clock the switching regulator 100 at a particular frequency or according to particular bit pattern.

In operation, the three shown circuits 200, 202, and 204 work to reduce ringing and conducted emissions in supply lines of the switching regulator 100 as the low-side switch 104 is turned off (i.e., from the conducting to non-conducting state) and the high-side switch 102 is turned on (i.e., from the non-conducting to the conducting state). When the low-side switch 104 is initially turned off, at the beginning of the blanking time, the diode 118 begins its reverse recovery, and the source follower circuit 200 supplies the gate (Vghs 124) of the high-side switch 102 with a signal that is limited to a particular current and voltage that is considerably lower than Vin 106. For example, in an automobile, Vin 106 may be 14V, and the voltage from source follower circuit 200 may be only 3V or 5V and include a limited current of approximately 1 mA. In one embodiment, this low output signal, which is clocked according to ON1 210, is supplied to Vghs 124 during reverse recovery of the diode 118.

The switch sensing circuit 202 senses the near or actual completion of the reverse recovery of diode 118 and generates an output voltage signal of its own to supply to Vghs 124. In one embodiment, the output voltage signal from the switch sensing circuit 202 gradually (e.g., linearly) increases as the diode 118 progresses through reverse recovery. For example, the diode 118 may reverse recover from −0.7V to 0V, and the switch sensing circuit 202 may begin providing the output signal when the diode 118 is either fully recovered (i.e., 0V), or is within a certain threshold of recovery (e.g., −0.3v, −0.2V, etc.). The additional output voltage from the switch sensing circuit 202, when combined with the output voltage signal from the source follower circuit 200 turns the high-side switch 102 more fully on, charging the gate to allow the high-side switch 102 to begin supplying a voltage at SW 128 that increases toward Vin 106. Limiting the "turn on" voltage of the high-side switch 102 allows the current slew rate at Lbh 108 to be controlled in order to avoid excessive ringing between Lbh 108 and Lbl 112. It also ensures that the maximum current in the high-side switch 102 is controlled before reverse recovery of diode 118 finishes.

As the high-side switch 102 charges and progresses toward full on mode, the voltage at node SW 128 increases toward Vin 106. The gate charging circuit 204 takes over when the voltage at node SW 128 reaches a certain threshold below Vin 106. When that occurs, the gate charging circuit supplies a much larger current to Vghs 124 to quickly and efficiently fully open the high-side switch 102. In one embodiment, the gate charging circuit 204 provides gate-charging current to the gate of the high-side switch 102 to quickly bring the high-side switch 102 to meet or exceed its drain-to-source "on resistance," commonly referred to as Rds(on). In one embodiment, the high-side switch 102 is turned on through application of a turn-on voltage (Vturn_on) and corresponding large current from the switch sensing circuit 202 for a small Rds(on) when the SW node 128 is at or approximately equal to a "full turn-on threshold" of ILimit times Rds(on) of the high-side switch 102 plus an additional excess voltage (Vexcess):

$$V(\text{turn on}) = I\text{Limit} * \text{Rds(on)} + \text{Vexcess}$$

Vexcess may be any offset voltage, such as, for example but without limitation, 200 mV, 500 mV, 1V, 5V, etc. Waiting until the voltage at SW 128 is within such a turn-on voltage ensures that the high-side switch 102 is never turned on until reverse recovery is completed, thus adding higher power efficiency to the switching regulator 100.

FIG. 3 is a schematic diagram of driver circuitry for reducing ringing and conducted emission in supply lines of switching regulator 100 with NMOS switches in accordance with one embodiment. The source follower circuit 200, switch sensing circuit 202, and gate charging circuit 204 are illustrated in more detail. The depicted circuits 200, 202, and 204 are but one embodiment. Other embodiments use equivalent circuit elements that function in the same manner or perform equivalent operations. Thus, all embodiments are not limited to the circuits shown and may include additional or alternative circuitry with departing from the scope of the invention.

Source follower circuit 200, switch sensing circuit 202, and gate charging circuit 204 that can be used to perform the previously discussed functions. Source follower circuit 200 includes an input voltage V1 300; a current source Ilimit 302; transistors 304, 306, 308, 320, and 323; diodes 310 and 320; a resistor 322; and inverters 312, 314. Switch sensing circuit 202 includes a bootstrap voltage source Vbs 326; an input voltage 347 (which may, in some embodiments, be the same as V1 300); transistors 328, 330, 332, 336, 338, 344; resistors 342, 348; a current source I1 340; and diodes 334, 346. Gate charging circuit 204 includes receives the bootstrap voltage source Vbs 326 and inverted clock signal ON2 212, after inversion by inverter 400, and includes a transistor 352.

The source follower circuit 200 receives a PWM clock signal ON1 210 and an input voltage V1 300. A voltage source V1 300, which has a voltage considerably lower than Vin 106 (e.g., 3.3V compared to 14V), is connected to a current source (ILimit) 302 and the drain of an n-type transistor 304. ILimit 302 is provided to the drain of an n-type transistor 306, and the source of transistor 306 is coupled to the drain of an n-type transistor 308. Transistor 308 includes a diode 310 coupled between its source and drain, as illustrated. The gates of transistor 304 and 306 are connected to each other and to the current source 302, and a resistor 322 separates the source of transistor 304 from GND 110. The source of transistor 308 is connected to GND 110. Additionally, n-type transistors 316 and 323 are used in a high-voltage cascode manner to protect the transistors 304, 306, and 308 from the high-side switch 102 when the latter operates at higher voltages. Moreover, the source of transistor 316, which has a diode 320 tied from its source to drain, is coupled to the source of transistor 323. Finally, the drain of transistor 316 is provided as an output signal 324 of the source follower circuit 200 to Vghs 124.

Transistor 316 receives a delayed version clock signal ON1 210—as delayed by inverters 312 and 314—and has its source coupled to the source of transistor 323 and supplies an output signal of the source follower circuit 200 from its drain. ON1 210 is passed through a series of delays, inverters 312 and 314, before being provided to the gates of an n-type transistor 316 and an n-type transistor 323. Inverters 312 and 314 are added to delay ON1 210 before reaching drive transistors 316 and 323. Additional or fewer inverters may be used in different embodiments depending on the desired clock signaling from ON1 210. As previously mentioned, ON1 210 provides a clocking signal to synchronize the output of the source follower circuit 200. For example, ON1 210 may be set at 300 kHz and thus synchronize the output signal 324 of the source follower circuit 200 accordingly.

In operation, once the low-side switch 104 is turned off, the high-side switch 102 is supplied with the current-limited signal from the source follower circuit 200 to begin turning the high-side switch 102 on. The output signal 324 supplied to the gate of the high-side switch 102 (again, Vghs 124) comprises a low voltage V1 300 (e.g., 3.3V, 5V, etc.) when compared to Vin 106 (e.g., 14V) and a current that is limited to ILimit 302. Limiting the current to ILimit 302 helps control the current slew rate and limit the maximum current provided during reverse recovery of diode 118. In one embodiment, this current-limiting mode of operation only occurs while the diode 118 is reverse recovering.

The switch sensing circuit 202 receives ON1 210 and a voltage from a bootstrap capacitor (Vbs) 326. Two p-type transistors 328 and 330 receive Vbs 326, and the transistors 328 and 330 are connected together in a current-mirror orientation, as shown. The drain of transistor 328 is coupled to the drain of an n-type transistor 332, and a diode 334 is connected between transistor 332's source and drain. The source of transistor 332 is connected to the drain an n-type transistor 336, which is connected in a current-mirror orientation to another n-type transistor 338. A current source (I1) 340 is positioned between the source of transistor 336 and GND 110. A resistor 342 is coupled on one end to the drain of transistor 338 and on the other end to the gate of an n-type transistor 344, which has a diode 346 connected between its source and drain. Another resistor 348 is positioned between the sources of transistors 338 and 346.

After reverse recovery, Vghs 124 is further increased by an output signal 350 generated by the switch sensing circuit 202. When the low-side switch 104 is turned off, the switch sensing circuit 204 operates to sense when diode 118 finishes reverse recovery. After the low-side switch 104 is turned off and during the beginning of the blanking time, the voltage at SW 128 may be low but increasing as the diode 118 recovers. For example, the voltage at SW 128 may equal −0.7V at the beginning of the blanking time and increasing over time to 0V. Suppose V1 347 is set at 1.1V, resistors 342 and 348 combine to draw 400 mV, and the transistor 336 has a gate-to-source threshold voltage of 0.8V. Then, transistor 336 will turn on when the voltage at SW 128 reaches −0.1V (which may be when reverse recovery has completed), as shown in the following equation:

$$1.1V-0.4V+0.1V=0.8V$$

Turning on transistor 336 in response to the voltage detected at node SW 128 causes the voltage Vbs 326 at a current level set by current source 340 to be supplied to Vghs 124 as output voltage signal 350 from the switch sensing circuit 202.

In one embodiment, the switch sensing circuit 202 does not supply output voltage 350 to the high-side switch 102 until reverse recovery of diode 118 is either complete or near complete (i.e., within a certain threshold of complete). For example, if node SW 128 ranges from −0.6V to 0.1V during reverse recovery of diode 118, switch sensing circuit 202 may configured to only turn on transistor 336 when SW 128 is at −0.1V, i.e., the end of the reverse recovery range. Alternatively, some embodiments may configure switch sensing circuit 202 to turn on when SW 128 is at −0.3V, i.e., within a certain threshold (e.g., 1%, 2%, 3%, 5%, 10%, 15%, 20%, etc.) of the ending of reverse recovery.

In one embodiment, gate charging circuit 204 receives ON2 212, delayed by inverter 400, and Vbs 326 at the gate and source of a p-type transistor 352, respectively. As the high-switch 102 gets closer to being fully turned on, the voltage at node SW 128 increases toward Vin. When SW 128 reaches the aforementioned full turn-on threshold of Vin, the gate charging circuit 204 is configured to supply a large current to Vghs 124 to fully turn on the high-side switch 102, drastically ramping up the current at Vghs 124 to fully turn on the high-side switch 102.

The present invention has been described in relation to particular embodiments, which are intended in all respects to be illustrative rather than restrictive. Alternative embodiments will become apparent to those of ordinary skill in the art to which the present invention pertains without departing from its scope.

From the foregoing, it will be seen that this invention is one well adapted to attain all the ends and objects set forth above, together with other advantages which are obvious and inherent to the system and method. It will be understood that certain features and sub-combinations are of utility and may be employed without reference to other features and sub-combinations. This is contemplated by and is within the scope of the claims.

The invention claimed is:

1. A system for operating a switching regulator comprising a high-side switch coupled to a low-side switch that is coupled to a diode, the system comprising:
   a source follower circuit configured to supply a gate of the high-side switch with a first current-limited signal when the low-side switch is turned off; and
   a switch sensing circuit configured to sense completion of reverse recovery in the diode and supply the gate of the high-side switch with a second current-limited signal upon completion of the reverse recovery in the diode, the switch sensing circuit comprising a current source that is switchably controlled in response to the sensed completion of reverse recovery in the diode to source the second current-limited signal for application to the gate of the high-side switch.

2. The system of claim 1, wherein the source follower circuit and the switch sensing circuit are clocked according to a clock signal.

3. The system of claim 1, wherein the source follower circuit comprises a first current source that sets a limit of the first current-limited signal supplied to the gate of the high-side switch, and wherein the switch sensing circuit comprises a second current source that sets a limit of the second current-limited signal supplied to the gate of the high-side switch.

4. The system of claim 1, wherein receipt of the first current-limited signal at the gate of the high-side switch initiates turning on the high-side switch to allow an input voltage received by the high-side switch to pass from a first transistor terminal to a second transistor terminal.

5. The system of claim 4, wherein the switch sensing circuit is configured to sense a voltage at the second transistor terminal that indicates the completion of the reverse recovery of the diode.

6. The system of claim 5, wherein the switch sensing circuit comprises a plurality of transistors operative to generate the second current-limited signal upon completion of the reverse recovery of the diode.

7. The system of claim 4, wherein the switch sensing circuit is configured to sense a voltage at the second transistor terminal that indicates the diode has a voltage within a threshold voltage difference from full reverse recovery of the diode.

8. The system of claim 1, wherein the first current-limited signal initiates turning on of the high-side switch with a first voltage level and the second current-limited signal continues turning on the high-side switch with a second voltage level greater than the first voltage level.

9. A switching regulator system, comprising:
a high-side switch receiving an input voltage;
a low-side switch coupled to the high-side switch;
a diode coupled across two terminals of the low-side switch; and
a switch sensing circuit, comprising:
a sense circuit configured to sense completion of reverse recovery in the diode;
a current source circuit configured to source a current to the gate of the high-side switch in response to the sense circuit sensing completion of the reverse recovery in the diode, wherein the current is operative to cause a limited turn on of the high-side switch, the current source circuit comprising a current source that is switchably controlled in response to the sensed completion of reverse recovery in the diode to source the current to the gate of the high-side switch.

10. The system of claim 9, further comprising a source follower circuit configured to provide a current-limited output signal to the gate of the high-side switch, said current limited output signal operative to cause initiation of turn on of the high-side switch.

11. The system of claim 10, further comprising a gate charging circuit configured to supply a non-current limited output signal to the gate of the high-side switch, the non-current limited output signal operative to fully turn on the high-side switch.

12. A circuit, comprising:
a high-side transistor coupled between a first supply node and a sense node;
a low-side transistor coupled between the sense node and a second supply node;
a first circuit comprising:
a source-follower transistor having a gate coupled to receive a first current from a first current source and a source node configured to generate a first signal; and
a first switching circuit configured to selectively apply the first signal to a gate of the high-side transistor in response to turn off of the low-side transistor;
a second circuit, comprising:
a sense circuit configured to sense a voltage at the sense node and detect a reverse recovery state;
a current mirror having an input coupled to receive a second current from a second current source and an output configured to generate a second signal for application to the gate of the high-side transistor; and
a second switching circuit configured to selectively apply the second current to the current mirror in response to sense circuit detection of the reverse recovery state.

13. The circuit of claim 12, wherein the first circuit further comprises a diode-connected transistor coupled to receive the first current from the first current source, and wherein the gate of the source-follower transistor is coupled to the gate of the diode-connected transistor.

14. The circuit of claim 12, wherein the first circuit further comprises a resistor coupled between the source node of the source-follower transistor and the second supply node.

15. The circuit of claim 12, wherein said first switching circuit is controlled to selectively apply the first signal in response to a control signal have a logic state indicating that said low-side transistor is turned off.

16. The circuit of claim 12, further comprising a third circuit including a transistor switch that is selectively actuated to apply a bootstrapped voltage to the gate of the high-side after said first and second switching circuits have been actuated.

17. The circuit of claim 12, wherein the first signal is generated from a first voltage level and the second signal is generated from a second voltage level greater than the first voltage level.

18. The circuit of claim 17, wherein the second voltage level is a bootstrapped voltage level greater than a voltage at said first supply node.

* * * * *